(12) United States Patent
Aoshima et al.

(10) Patent No.: US 6,838,222 B2
(45) Date of Patent: Jan. 4, 2005

(54) PHOTOPOLYMERIZABLE COMPOSITION

(75) Inventors: Keitaro Aoshima, Shizuoka-ken (JP); Kazuhiro Fujimaki, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/073,854

(22) Filed: Feb. 14, 2002

(65) Prior Publication Data

US 2002/0160295 A1 Oct. 31, 2002

(30) Foreign Application Priority Data

Feb. 22, 2001 (JP) .................................... 2001-046615

(51) Int. Cl.$^7$ .................. G03F 7/033; G03F 7/037; G03F 7/028; G03F 7/029
(52) U.S. Cl. .................. 430/176; 430/283.1; 430/944; 430/916; 430/923; 430/921; 430/925; 430/929; 430/910; 430/920; 430/918; 430/926
(58) Field of Search ................. 430/283.1, 176

(56) References Cited

U.S. PATENT DOCUMENTS

| | | | | |
|---|---|---|---|---|
| 3,725,356 A | * | 4/1973 | Luders et al. | 526/262 |
| 3,839,171 A | * | 10/1974 | Akamatsu et al. | 522/107 |
| 4,019,972 A | * | 4/1977 | Faust | 430/283.1 |
| 4,476,215 A | * | 10/1984 | Kausch | 430/281.1 |
| 4,499,163 A | | 2/1985 | Ishimaru et al. | |
| 4,510,227 A | | 4/1985 | Mohr et al. | |
| 4,772,538 A | * | 9/1988 | Walls et al. | 430/284.1 |
| 4,950,581 A | * | 8/1990 | Koike et al. | 430/281.1 |
| 4,952,478 A | * | 8/1990 | Miyagawa et al. | 430/138 |
| 5,080,999 A | * | 1/1992 | Imai et al. | 430/175 |
| 5,200,292 A | | 4/1993 | Shinozaki et al. | |
| 5,246,816 A | * | 9/1993 | Yamasita et al. | 430/284.1 |
| 5,340,699 A | | 8/1994 | Haley et al. | |
| 5,641,608 A | * | 6/1997 | Grunwald et al. | 430/302 |
| 5,705,322 A | | 1/1998 | West et al. | |
| 5,919,601 A | | 7/1999 | Nguyen et al. | |
| 5,952,154 A | | 9/1999 | Barr et al. | |
| 5,965,319 A | | 10/1999 | Kobayashi | |
| 6,013,412 A | | 1/2000 | Aoshima | |
| 6,030,750 A | | 2/2000 | Vermeersch et al. | |
| 6,309,792 B1 | | 10/2001 | Hauck et al. | |
| 6,399,689 B1 | | 6/2002 | Scarlette | |
| 6,423,462 B1 | | 7/2002 | Kunita | |
| 6,482,571 B1 | | 11/2002 | Teng | |
| 6,566,035 B1 | * | 5/2003 | Aoshima | 430/270.1 |
| 6,576,401 B2 | | 6/2003 | Teng | |
| 2002/0160295 A1 | | 10/2002 | Aoshima et al. | |
| 2003/0008239 A1 | * | 1/2003 | Fujimaki et al. | 430/302 |
| 2003/0073032 A1 | | 4/2003 | Aoshima | |
| 2003/0082478 A1 | | 5/2003 | Itakura et al. | |

FOREIGN PATENT DOCUMENTS

| | | |
|---|---|---|
| CA | 1338095 | 2/1996 |
| EP | 0 377 321 A2 | 7/1990 |
| EP | 0 684 522 A1 | 11/1995 |
| EP | 0 779 161 A1 | 6/1997 |
| EP | 0 919 870 A1 | 6/1999 |
| EP | 0 950 517 A1 | 10/1999 |
| EP | 0 950 518 A1 | 10/1999 |
| EP | 1096315 A1 * 5/2001 | ........... G03F/7/029 |
| JP | A-2-161442 | 6/1990 |
| WO | WO 00/48836 | 8/2000 |

OTHER PUBLICATIONS

Ben–zyl from The American Heritage Dictionary of the English Language, Fourth Edition, Copyright 200 by Houghton Mifflin Cjompany found at yourdictionary.com, one page.*
Registry No. 2154–56–5, one page, common name "benzyl" from ACS, copyright 2003, STIN database search.*
McGinniss, Vincent D., "Radiation Curing: 6. Curing with Ultraviolet, Visible and Infrared Processing Equipment" from Kirk–Othmer Encyclopedia of Chemical Technology, copyright 1996, by John Wiley & Sons, Inc, Article Online posting date Dec. 4, 2000.*
SR–295, product bulletin, SARTOMER Company, Exton, PA, one page, dated Nov. 1998 from internet through Sartomer web site.*
SR–399, product bulletin, SARTOMER Company, Exton, PA, one page, dated Nov. 1998 from internet through Sartomer web site.*
SR–492, product bulletin, SARTOMER Company, Exton, PA, one page, dated Nov. 1998 from internet through Sartomer web site.*
CD 501, product bulletin, SARTOMER Company, Exton, PA, one page, dated May 1999 from internet through Sartomer web site.*
SR–368, product bulletin, SARTOMER Company, Exton, PA, 1 pate, dated Nov. 1998, from inernet through Sartomer we site.*
Product Data, Scripset 550 Styreen Maleic Anhydride Copolymer Solid, Hercules Incorporated, copyright 1999, Dated Jun. 2000 from internet.*
Mineo et al, 0806283, English Abstract of Japanese Published Application 0806283 Dated Mar. 8, 1996, 1 Page, Patent Abstracts of Japan Dated 1996.
Mineo et al., 08062834, English Abstract of Japanese Published Application 08062834 dated Mar. 8, 1996, 1 pg, Patent Abstracts of Japan dated 1996.

* cited by examiner

Primary Examiner—Cynthia Hamilton
(74) Attorney, Agent, or Firm—Burns, Doane, Swecker & Mathis, L.L.P.

(57) ABSTRACT

A photopolymerizable composition that is cured with visible light or an infrared laser and is used as a recording layer in a negative planographic printing plate precursor. The photopolymerizable composition is cured by exposure and includes (A) a polymerizable compound that is solid at 25° C. and has at least one radical-polymerizable ethylenically unsaturated double bond in a molecule, (B) a radical polymerization initiator, (C) a binder polymer and, as required, (D) a compound generating heat by infrared exposure.

24 Claims, No Drawings

PHOTOPOLYMERIZABLE COMPOSITION

BACKGROUND OF THE INVENTION

1. Field of the Invention

The present invention relates to a photopolyinerizable composition which can be cured by exposure to ultraviolet light, visible light and infrared light. More specifically, it relates to a photopolymerizable composition that is suitable for use as a recording layer in a negative planographic printing plate precursor.

2. Description of the Related Art

Various systems for making planographic printing plates directly from digital data of a computer have been developed. For example, photopolymerizable image-forming materials that are exposed to a laser emitting blue or green visible light have attracted much interest for use as a recording layer in a planographic printing plate that can achieve high printing resistance due to a tough coating cured by photopolymerization, because the photopolymerizable image-forming materials are sensitive to argon lasers or the equivalent and because it is possible to directly make plates that have high sensitivity using a photopolymerization initiation system.

One example of laser printing plates that utilize a photo-polymerization initiation system sensitive to visible lasers such as argon lasers and that have been used are printing plates comprising an aluminum support having sequentially disposed thereon a photopolymerizable composition layer and an oxygen-blocking layer that inhibits polymerization. The photopolymerizable composition layer comprises a photopolymerization initiator and a compound including an addition-polymerizable ethylene double bond, and may further comprise if desired an organic high-molecular binder and a heat polymerization inhibitor. In these photopolymerizable planographic printing plates, an image is obtained by exposing a desired image, curing an exposed area by polymerization and removing (developing) an unexposed area with an alkaline aqueous solution.

In recent years, the development of lasers has been remarkable. In particular, high-output, compact solid-state lasers and semiconductor lasers that emit infrared light having a wavelength of 760 nm to 1,200 nm have become readily accessible. These lasers are quite suitable for use as a recording light source when plates are directly made from digital data of a computer. For this reason, in addition to the many photosensitive recording materials such as those mentioned above that are sensitive to visible light having a wavelength of less than 760 nm, materials recordable with these infrared lasers have been in demand. For example, photopolymerizable compositions comprising an infrared absorbent, a photopolymerization or heat polymerization initiator, and a compound having a functional group capable of being polymerized or crosslinked have been used as recording layers in negative image recording materials.

Photopolymerizable compositions that are cured by either visible light or infrared light basically comprise a polymerization initiator such as a radical generating agent, a monomer having a polymerizable functional group, and a binder polymer for improving a film property of the recording layer. A radical is generated from an initiator in the exposed (heated) region by exposure or heating, the radical causes a polymerization/crosslinking reaction of a polymerizable compound, and a curing reaction of a recording layer is conducted, whereby an image area is formed. The photopolymerizable composition contains a large amount of a polymerizable compound which is, in many cases, a relatively low-molecular compound such as a monomer or an oligomer.

Planographic printing plate precursors are usually stacked, stored, and transported. When the plate precursors are stacked, photosensitive layer surfaces and reverse surfaces of the supports are closely adhered. As a negative recording layer, the exposure-curable photopolymerizable composition in the photosensitive layer has a relatively low strength before being cured by crosslinking or polymerization, and contains a large amount of a polymerizable low-molecular compound. For this reason, the recording layer is relatively soft and plastic flow occurs easily.

There have thus been problems in that the support and the photosensitive layer easily adhere to one another and are difficult to separate when the plates are taken out one by one. Further, when plates deviate from the stack or are sequentially carried out for processing beginning with the uppermost plate in the stack, there have been problems such as the recording layer being deformed due to plastic flow and the surface of the recording layer sustains damage due to abrasion, whereby workability decreases and there is image trouble due to the recording layer sustaining damage during separation.

SUMMARY OF THE INVENTION

It is an object of the present invention to provide a photopolymerizable composition that is cured at high sensitivity with visible light or an infrared laser, that can be used as a recording layer in a negative planographic printing plate precursor that can be directly recorded from digital data of a computer, that does not cause plastic flow even when forming a recording layer, that can suppress adhesion of, deformation of, and damage to a recording layer even when the plates are stacked and stored, and that can form a high-quality image.

The present inventors focussed on polymerizable compounds contained in a large amount in photopolymerizable compositions. Consequently, they found that the foregoing object can be attained by using a polymerizable compound having specific properties. This finding led to the completion of the present invention.

That is, the photopolymerizable composition of the present invention is characterized in that it is cured by exposure and includes (A) a polymerizable compound which is solid at 25° C. and has at least one radical-polymerizable ethylenically unsaturated double bond in a molecule, (B) a radical polymerization initiator and (C) a binder polymer. In view of a recording sensitivity, it is preferable that the photopolymerizable composition contains a photosensitizer.

The photopolymerizable composition further includes (D) a compound generating heat by infrared exposure, whereby it becomes possible to cure the composition by exposing the same to an infrared laser.

In the present invention, a compound which is solid at 25° C. is used as the polymerizable compound having a radical-polymerizable ethylenically unsaturated double bond. Accordingly, even when a stress is exerted when the composition is not being exposed, plastic flow of the composition stemming from a polymerizable low-molecular compound does not occur. When the composition is used as a recording layer in a planographic printing plate precursor, deformation or damage due to plastic deformation of the recording layer can effectively be suppressed, whereby it becomes possible to form an image of excellent quality.

When the photopolymerizable composition is used as a recording layer in a planographic printing plate and is exposed to ultraviolet or visible light, it is necessary to further dispose a protective layer that blocks oxygen. By disposing an oxygen-blocking protective layer, the recording layer is less exposed to the atmosphere and is less susceptible to damage resulting from plastic flow. However, when the photopolymerizable composition is exposed to infrared rays (i.e., an infrared laser), because heat-mode recording is conducted, wherein an image is formed by generating heat abruptly and locally, it is not always necessary to dispose the oxygen-blocking layer. Thus, the effects of the present invention are particularly remarkable when the photopolymerizable composition is used as a recording layer.

DETAILED DESCRIPTION OF THE PREFERRED EMBODIMENTS

The photopolymerizable composition of the present invention is characterized in that a compound that is solid at 25° C. is used as a polymerizable compound together with an initiator and a photosensitizer that is used as required. Namely, the photopolymerizable composition comprises (A) a polymerizable compound which is solid at 25° C. and has at least one radical-polymerizable ethylenically unsaturated double bond in a molecule, (B) a radical polymerization initiator, and (C) a binder polymer.

(A) The Polymerizable Compound

The solid polymerizable compound of the present invention is radical-polymerizable, has at least one ethylenically unsaturated double bond in a molecule and has at least one, preferably two or more, terminal ethylenically unsaturated double bonds, and is selected from monomers and oligomers that are solid at 25° C.

Compounds having a melting point or a glass transition point of 25° C. or higher are preferably used as the solid polymerizable compound in the present invention. Compounds having a melting point or a glass transition point of 40° C. or higher are more preferable.

In view of molecular structure, compounds having at least one amide bond in a molecule are preferable. The amide bond accelerates local polarization of the molecule and increases an intermolecular electrostatic attraction. Accordingly, introducing an amide bond in the molecule can raise the melting point or glass transition point.

Examples of compounds that can be used include, but are not limited to, the following: acrylates and methacrylates having amide bond(s) in a molecule, such as tris(acryloxyethyl) isocyanurate, tris(methacryloxyethyl) isocyanurate, 1,3,5-tris(2-acryloxyethylaminocarbonyl)benzene and 1,3,5-tris(2-methacryloxyethylaminocarbonyl)benzene; acrylamides and methacrylamides such as N-cyclohexylacrylamide, N-cyclohexylmethacrylamide, N,N'-diacryloylhexamethylenediamine, N,N'-dimethacryloylhexamethylenediamine, p-bis(acryloylamino)benzene, p-bis(methacryloylamino)benzene, 1,3,5-tris(2-acryloylaminoethoxycarbonyl)benzene and 1,3,5-tris(2-methacryloylaminoethoxycarbonyl)benzene; and styrenes having amide bond(s) in a molecule, such as N,N'-bis(styrylcarbonyl)hexamethylenediamine, N,N'-bis(stylylcarbonyl)-1,4-cyclohexylenediamine, 1,3,5-tris(2-styrylcarbonylaminoethoxycarbonyl)benzene and 1,3,5-tris(2-styrylcarboxylethylaminocarbonyl)benzene.

These may have a chemical form of, for example, a monomer or a prepolymer, namely a dimer, a trimer, an oligomer or a mixture thereof, or a copolymer thereof, as long as they maintain a solid form in the photopolymerizable composition.

The solid polymerizable compounds may be used either singly or in combination as required. The content of the solid polymerizable compound is preferably 5 to 80% by weight, more preferably 10 to 60% by weight, as solid content in the photopolymerizable composition of the present invention.

In the photopolymerizable composition of the present invention, general polymerizable compounds can be used in combination as long as the effects of the invention are impaired. The amount thereof is limited to a range where the composition does not induce plastic flow. Specifically, general polymerizable compounds can be added in the range of 30% by weight or less based on the solid content of the photopolymerizable composition.

The general radical-polymerizable compound is selected from known radical-polymerizable compounds having at least one ethylenically unsaturated double bond. These have a chemical form of, for example, a monomer, a prepolymer, an oligomer, a mixture thereof or a copolymer thereof. Examples of the monomer and the copolymer thereof include unsaturated carboxylic acids (such as acrylic acid, methacrylic acid, itaconic acid, crotonic acid, isocrotonic acid and maleic acid) and esters and amides thereof. Esters of unsaturated carboxylic acids and aliphatic polyhydric alcohol compounds and amides of unsaturated carboxylic acids and aliphatic polyvalent amine compounds are preferably used. Further, addition reaction products of unsaturated carboxylic acid esters or amides having a nucleophilic substituent such as a hydroxyl group, an amino group or a mercapto group and monofunctional or polyfunctional isocyanates or epoxy compounds, and dehydrocondensation reaction products with monofunctional or polyfunctional carboxylic acids are preferably used. Still further, addition reaction products of unsaturated carboxylic acid esters or amides having an electrophilic substituent such as an isocyanato group or an epoxy group and monofunctional or polyfunctional alcohols, amines or thiols, and substitution products of unsaturated carboxylic acid esters or amides having a leaving substituent such as a halogen group or a tosyloxy group and monofunctional or polyfunctional alcohols, amines or thiols are also preferable. Moreover, as other examples, compounds obtained by replacing the foregoing unsaturated carboxylic acids with unsaturated phosphonic acid or styrene are also available.

(B) The Radical Polymerization Initiator

The radical polymerization initiator used in the present invention is selected from compounds that generate a radical by application of energy such as light, heat or radiation. Various photo-initiators known in patents or in the literature can selectively be used either singly or in combination (photo-initiator system) depending on the wavelength of the light source used to initiate polymerization.

For example, when ultraviolet light having a wavelength of 400 nm or less is used as the light source, benzil, benzoin ether, Michler's ketone, anthraquinone, acridine, phenazine and benzophenone are widely used.

Even when visible light having a wavelength of 400 nm or more, an argon laser or a YAG-SHG laser is used as the light source, various photo-initiator systems can be proposed. Examples thereof can include photosensitive dyes of the kind disclosed in U.S. Pat. No. 2,850,445, composite initiator systems of dyes and amines (JP-B No. 44-20189), combined systems of hexaarylbiimidazoles, radical generating agents and dyes (JP-B No. 45-37377), systems of hexaarylbiimidazoles and p-dialkylaminobenzylidene ketones (JP-B No. 47-2528 and JP-A No. 54-155292), systems of cyclic cis-α-dicarbonyl compounds and dyes (JP-A No. 48-84183), systems of substituted triazines and merocyanine dyes (JP-A No. 54-151024), systems of 3-ketocoumalin and activators (JP-A Nos. 52-112681 and 58-15503), systems of biimidazoles, styrene derivatives and thiols (JP-A No. 59-140203), systems of organic peroxides and dyes (JP-A Nos. 59-140203 and 59-189340), systems of dyes having a rhodanine skeleton and radical generating agents (JP-A No. 2-244050), systems of titanocene and 3-ketocoumalin dyes (JP-A No. 63-221110), systems of titanocene and xanthene dyes and further addition-polymerizable ethylenically unsaturated compounds having an amino group or a urethane group (JP-A Nos. 4-221958 and 4-219756) and systems of titanocene and specific merocyanine dyes (JP-A No. 6-295061).

Further, when exposure is conducted with infrared light having a wavelength of 760 nm or more, an onium salt is preferably used in view of sensitivity. Specific examples of the onium salt include iodonium salts, diazonium salts and sulfonium salts. These onium salts also function as an acid generating agent. However, in the present invention, since they are used in combination with the solid radical-polymerizable compound, they function as a radical polymerization initiator. Preferable examples of the onium salt used in the present invention include onium salts represented by the following formulas (III) to (V).

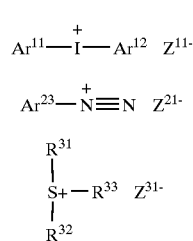

Formula (III)

Formula (IV)

Formula (V)

In formula (III), each of $Ar^{11}$ and $Ar^{12}$ independently represent an optionally substituted aryl group having 20 or less carbon atoms. When the aryl group has a substituent, preferable examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from the group consisting of a halogen ion, a carboxylate ion, a perchlorate ion, a tetrafluoroborate ion, a hexafluorophosphate ion and a sulfonate ion. A perchlorate ion, a hexafluorophosphate ion and an arylsulfonate ion are preferable.

In formula (IV), $Ar^{21}$ represents an optionally substituted aryl group having 20 or less carbon atoms. Preferable examples of the substituent include a hydrogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms. $Z^{21-}$ and $Z^{11-}$ represent the same counter ion.

In formula (V), each of $R^{31}$, $R^{32}$ and $R^{33}$, which may be same or different, represents an optionally substituted hydrocarbon group having 20 or less carbon atoms. Preferable examples of the substituent include a halogen atom, a nitro group, an alkyl group having 12 or less carbon atoms, an alkoxy group having 12 or less carbon atoms and an aryloxy group having 12 or less carbon atoms. $Z^{31-}$ and $Z^{11-}$ represent the same counter ion.

Specific examples of the onium salt used in the present invention include those disclosed in JP-A No. 11-310623, paragraphs [0030] to [0033].

The polymerization initiator used in the present invention has a maximum absorption wavelength of, preferably 400 nm or less, more preferably 360 nm or less. Thus, the absorption wavelength is in the ultraviolet region, whereby a planographic printing plate precursor can be handled under white light.

These polymerization initiators may be used either singly or in combination.

The polymerization initiators can be added in amounts of 0.1 to 50% by weight, preferably 0.5 to 30% by weight, more preferably 1 to 20% by weight based on the total solid content of the photopolymerizable composition. When the amount is less than 0.1% by weight, sensitivity decreases. When the amount exceeds 50% by weight, the non-image area tends to be stained in printing when using the composition as a recording layer in a planographic printing plate. The polymerization initiators may be added to the same layer with other components, or to a layer separately formed.

(C) The Binder Polymer

Since a solid-state polymerizable compound is used in the photopolymerizable composition of the present invention, a binder polymer is added to maintain the solid polymerizable compound and to form a film.

A linear organic polymer is preferably used as the binder. Any polymer can be used as the linear organic polymer. When the photopolymerizable composition of the present invention is used as a recording layer in a planographic printing plate, it is preferable to select a linear organic polymer which can be dissolved or swollen with water or an alkaline solution to enable development with water or an alkaline solution. The linear organic polymer is selected and used not only as a film forming agent for forming a recording layer but also as an improver to improve developability in water, a weakly alkaline solution or an organic solvent. For example, the use of a water-soluble organic polymer enables development in water. Examples of the linear organic polymer include radical polymers having a carboxylic acid group in a side chain thereof, such as those disclosed in JP-A No. 59-44615, JP-B Nos. 54-34327, 58-12577 and 54-25957 and JP-A Nos. 54-92723, 59-53836 and 59-71048, namely methacrylic acid copolymers, acrylic acid copolymers, itaconic acid copolymers, crotonic acid copolymers, maleic acid copolymers and partially esterified maleic acid copolymers. Further examples include acid cellulose derivatives having a carboxylic acid group in a side chain thereof, and hydroxyl group containing polymers to which a cyclic acid anhydride is added.

Of these, acrylic resins or methacrylic resins having a benzyl group or an allyl group and a carboxyl group in a side chain thereof are especially preferable in view of excellent balance between film strength, sensitivity and developability.

Further, urethane-based binder polymers containing an acid group, as disclosed in JP-B Nos. 7-12004, 7-120041, 7-120042 and 8-12424, JP-A Nos. 63-287944, 63-287947 and 1-271741 and JP-A No. 10-116232, have excellent strength and are advantageous in view of printing resistance and suitability to low exposure.

In addition to these, polyvinyl pyrrolidone and polyethylene oxide are used as water-soluble linear organic polymers. In order to increase the strength of the cured coating, alcohol-soluble nylons and polyether of 2,2-bis(4-hydroxyphenyl) propane and epichlorohydrin are also effective.

The weight average molecular weight of the polymer used in the present invention is preferably 5,000 or more, more preferably 10,000 to 300,000, and the number average molecular weight is preferably 1,000 or more, more preferably 2,000 to 250,000. The degree of polydispersion (weight average molecular weight/number average molecular weight) is preferably 1 or more, more preferably 1.1 to 10.

These polymers may be random polymers, block polymers and graft polymers. Random polymers are preferable.

The binder polymers used in the present invention may be used either singly or in combination. These polymers are added in amounts of 20 to 95% by weight, preferably 30 to 90% by weight, based on the total solid content of the photopolymerizable composition. When the amount is less than 20% by weight, the strength of the image area in image formation is insufficient. When the amount exceeds 95% by weight, no image is formed. It is also preferable that the weight ratio of the compound having the radical-polymerizable ethylenically unsaturated double bond and the linear organic polymer is 1/9 to 7/3.

Other compounds that may be used as required in the photopolymerizable composition of the present invention are described below.

(D) Compound Generating Heat by Infrared Exposure

When the photopolymerizable composition of the invention is recorded with a laser that emits infrared light, it is preferable to add a compound that generates heat by infrared exposure (hereinafter sometimes referred to as an "infrared absorbent"). The infrared absorbent functions to convert infrared light that is absorbed to heat. The radical generating agent is decomposed by the heat generated, whereby the radical is generated. The infrared absorbent used in the present invention is a dye or a pigment having a maximum absorption wavelength of 760 nm to 1,200 nm.

Known, commercially available dyes disclosed in, for example, *Senryô Binran* ("Dye Catalog", edited by the Society of Synthetic Organic Chemistry, Japan, 1970), can be used. Specifically, those disclosed in paragraphs [0050] and [0051] of JP-A No. 10-39509 can be listed.

Cyanine dyes, squalilium dyes, pyrilium salts and nickel oleate complexes are especially preferable. Cyanine dyes are even more preferable, and cyanine dyes represented by formula (I) are most preferable.

Formula (I)

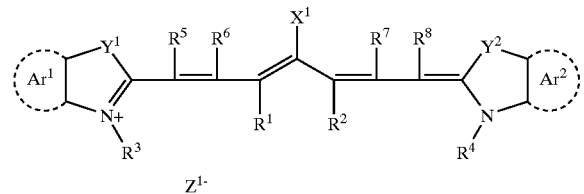

In formula (I), $X^1$ represents a halogen atom, $X^2$-$L^1$ or $NL^2L^3$. $X^2$ represents an oxygen atom or a sulfur atom, $L^1$ represents a hydrocarbon group having 1 to 12 carbon atoms, and $L^2$ and $L^3$ independently represent a hydrocarbon group having 1 to 12 carbon atoms. $R^1$ and $R^2$ independently represent a hydrocarbon group having 1 to 12 carbon atoms. In view of storage stability of the recording layer coating solution, it is preferable that $R^1$ and $R^2$ are hydrocarbon groups having 2 or more carbon atoms, and it is more preferable that $R^1$ and $R^2$ together form a 5-membered or 6-membered ring.

Each of $Ar^1$ and $Ar^2$, which may be the same or different, represents an optionally substituted aromatic hydrocarbon group. Each of $Y^1$ and $Y^2$, which may be the same or different, represents a sulfur atom or a dialkylmethylene group having 12 or less carbon atoms. Each of $R^3$ and $R^4$, which may be the same or different, represents an optionally substituted hydrocarbon group having 20 or less carbon atoms. Preferable examples of the substituent include an alkoxy group having 12 or less carbon atoms, a carboxyl group and a sulfo group. Each of $R^5$, $R^6$, $R^7$ and $R^8$, which may be the same or different, represents a hydrogen atom or a hydrocarbon group having 12 or less carbon atoms. From the standpoint of procuring of raw materials, a hydrogen atom is preferable. $Z^{1-}$ represents a counter anion, but is unnecessary when any of $R^1$ to $R^8$ is substituted with a sulfo group. Preferable examples of $Z^{1-}$ include a halogen ion, a perchlorate ion, a tetrafluoroborate ion, a hexafluorophosphate ion and a sulfonate ion in view of storage stability of the recording layer coating solution. A perchlorate ion, a hexafluorophosphate ion and an arylsulfonate ion are especially preferable.

Specific examples of the cyanine dyes represented by formula (I) which can appropriately be used in the invention can include those described in JP-A No.11-310623, paragraphs [0017] to [0019].

Examples of pigments that may be used in the present invention include commercially available pigments and pigments described in the Color Index (C.I.) catalog, *Saishin Ganryô Binran* ("Recent Pigment Catalog", edited by the Japan Pigment Technology Association, 1977), Saishin Ganryô Ôyô Gijutsu ("Recent Pigment Application Technology", published by CMC Shuppan, 1986), and *Insatsu Inki Gijutsu* ("Ink Printing Technology", published by CMC Shuppan, 1984).

Examples of the pigments include black pigments, yellow pigments, orange pigments, brown pigments, red pigments, purple pigments, blue pigments, green pigments, fluorescent pigments, metallic powder pigments and polymer bound coloring matter. These pigments are described in detail in JP-A No. 10-39509, paragraphs [0052] to [0054], and they can also be applied to the present invention. Of these pigments, carbon black is preferable.

The content of the dye or the pigment in the photopolymerizable composition is preferably 0.01 to 50% by weight, more preferably 0.1 to 10% by weight, based on the total solid content of the composition. In the case of the dye, the content is most preferably 0.5 to 10% by weight, and in the case of the pigment, the content is most preferably 1.0 to 10% by weight.

When the content is less than 0.01% by weight, sensitivity sometimes decreases. When the content exceeds 50% by weight, the non-image area is sometimes stained in the planographic printing plate precursor.

Other Components

Various other compounds may be added to the present invention as required. For example, a dye having large absorption in the visible light region can be used as an image colorant. In addition, pigments such as phthalocyanine pigments, azo pigments, carbon black and titanium oxide can be used.

These colorants are added after image formation to help distinguish between the image area and the non-image area when the composition of the invention is used as a recording layer in a planographic printing plate. The amount of colorant added is 0.01 to 10% by weight based on the total solid content of the composition.

It is preferable that a small amount of a heat polymerization inhibitor is added to the composition of the present invention to inhibit unnecessary heat polymerization of the compound having the radical-polymerizable ethylenically unsaturated double bond during preparation or storage of the coating solution. Preferable examples of the heat polymerization initiator include hydroquinone, p-methoxyphenol, di-t-butyl-p-cresol, pyrogallol, t-butyl cathecol, benzoquinone, 4,4'-thiobis(3-methyl-6-t-butylphenol) and 2,2'-methylenebis(4-methyl-6-t-butylphenol) and N-nitroso-N-phenylhydroxylamine ammonium salt. The amount of the heat polymerization initiator added is preferably approximately 0.01 to approximately 5% by weight based on the total amount of the composition. Moreover, in order to prevent polymerization inhibition due to oxygen, higher fatty acid derivatives such as behenic acid and behenic acid amide, can be added as required so that it is unevenly distributed during drying after coating on the surface of the photosensitive layer. The amount of the higher fatty acid derivatives is preferably approximately 0.1 to approximately 10% by weight based on the total amount of the composition.

In addition, in order to increase processing stability under developing conditions, nonionic surfactants disclosed in JP-A Nos. 62-251740 and 3-208514, and ampholytic surfactants disclosed in JP-A Nos. 59-121044 and 4-13149, can be added to the composition of the present invention.

Specific examples of the nonionic surfactants include sorbitan tristearate, sorbitan monopalmitate, sorbitan trioleate, stearic acid monoglyceride and polyoxyethylene nonylphenyl ether.

Specific examples of the ampholytic surfactants include alkyldi (aminoethyl) glycine, alkyl polyaminoethyl glycine hydrochloride, 2-alkyl-N-carboxyethyl-N-hydroxyethylimidazolinium betaine, N-tetradecyl-N,N-betaine (for example, trade name: Amogen K, manufactured by Daiichi Kogyo K.K.).

The proportion of the nonionic surfactant or the ampholytic surfactant in the photosensitive layer coating solution is preferably 0.05 to 15% by weight, and more preferably 0.1 to 5% by weight.

In order to impart flexibility to the coating, a plasticizer can be added to the composition of the present invention as required. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In the photopolymerizable composition of the present invention, the radical initiator is decomposed by energy locally applied to the exposure portion, whereby a radical is generated. The solid polymerizable compound that is presumed to be present in the form of an aggregate or fine crystals is melted by the acid or heat generated and becomes reactive, and the radical acts on the polymerizable functional group thereof, whereby a curing reaction proceeds. When exposure is conducted with visible light or infrared light, the polymerizable compound is rapidly melted by heat because a photothermal convertible dye or pigment is present in the initiator system, whereby the reaction proceeds. For this reason, it is preferable, in view of sensitivity, that the photopolymerizable composition of the present invention is used in the exposure to visible light or infrared light accompanied by heat generated by the exposure. In particular, because of the combined use of an infrared absorbent, it can preferably be used in recording by infrared laser exposure that causes high energy heat to be locally generated.

When the photopolymerizable composition of the present invention is used as a recording layer in a planographic printing plate precursor, the respective components comprising the photopolymerizable composition can usually be dissolved and dispersed in a solvent and coated on a support to form a recording layer.

Examples of the solvent used include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water. These solvents can be used either singly or in combination. The concentration of the components (total solid content including additives) in the solvent is preferably 1 to 50% by weight.

The amount (solid content) of the recording layer that is obtained after it has been coated on the support and dried varies with the use. In the case of a planographic printing plate precursor, it is preferably 0.5 to 5.0 $g/m^2$. The smaller the coating amount, the higher the apparent sensitivity. However, film characteristics of the photosensitive layer performing an image recording function drop.

Various methods can be used to coat the recording layer on the support. Examples thereof include bar coater coating, rotary coating, spray coating, curtain coating, dip coating, air knife coating, blade coating and roll coating.

Support

The support on which the recording layer is coated in the planographic printing plate precursor to which the composition of the present invention is applied is not particularly limited as long as it is a plate-like material having dimensional stability, desired strength and desired durability. Examples thereof include paper, paper laminated with plastics (for example, polyethylene, polypropylene and polystyrene), metallic plates (for example, aluminum, zinc and copper), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and paper or plastic films laminated or deposited with the foregoing metals. Polyester films and aluminum plates are preferable.

In particular, an aluminum plate that is lightweight and has excellent surface treatability, processability and corrosion resistance is preferable. Examples of aluminum materials used for this purpose include an Al—Mg alloy, an Al—Mn alloy, an Al—M—Mg alloy, an Al—Zr alloy and an Al—Mg—Si alloy.

The planographic printing plate precursor can be made by treating the surface of the aluminum plate (e.g., surface roughening) and coating the photosensitive layer on the aluminum plate. In roughening the surface of the aluminum plate, mechanical surface roughening, chemical surface roughening and electrochemical surface roughening are conducted either singly or in combination. It is also preferable to anodize the surface to ensure insusceptibility of the surface to damage, or to treat the surface to increase hydrophilicity.

Surface treatment of the support is described below.

Prior to roughening the surface of the aluminum plate, a degreasing treatment with, for example, a surfactant, an organic solvent or an alkaline aqueous solution may be administered to the aluminum plate in order to eliminate rolling oil on the surface as needed. When an alkaline aqueous solution is used, neutralization or a desmutting treatment may be administered with an acid solution.

In order to improve adhesion between the support and the photosensitive layer and to impart water retention to the non-image area, the support is subsequently subjected to a so-called graining treatment to roughen the surface of the support. Specific examples of graining methods include mechanical graining with a sand blast, and chemical graining, in which the surface is roughened with an etching agent comprising an alkali, an acid or a mixture thereof. Other known methods, such as electrochemical graining, roughening the surface by adhering grains to the support material using an adhesive or a procedure having the equivalent effect, and pressing on the support material a continuous belt or a roll having fine unevenness to transfer the unevenness, can also be employed.

These surface roughening methods may be conducted either singly or in combination, and the order and number of times the methods are conducted are optional. Since smut is generated on the surface of the support to which the foregoing surface roughening treatment (i.e., graining) has been administered, it is generally preferable to desmut the surface by water-washing or alkali etching.

When the aluminum support is used in the present invention, an oxide film is usually formed on the support by anodizing the surface after the foregoing pretreatment to improve wear resistance to abrasion, resistance to chemicals and water retention.

Any electrolyte can be used to anodize the aluminum plate as long as a porous oxide film is formed. Generally, sulfuric acid, phosphoric acid, oxalic acid, chromic acid or a mixed acid thereof is used. The concentration of the electrolyte is determined depending on the type of the electrolyte. The conditions of the anodization vary with the type of the electrolyte used and cannot be unconditionally specified. Generally, the concentration of the electrolyte is 1 to 80%, the temperature of the solution is 5° C. to 70° C., current density is 5 to 60 A/dm$^2$, voltage is 1 to 100 V and electrolysis time is 10 seconds to 5 minute. The amount of the anodized film is preferably 1.0 g/m$^2$ or more, and more preferably 2.0 to 6.0 g/m$^2$. When the amount of the anodized film is less than 1.0 g/m$^2$, printing resistance is insufficient, the non-image area of the planographic printing plate is susceptible to damage, and so-called "damage-staining", in which ink adheres to damaged portions in printing, tends to occur.

The aluminum support can be used by treating the support with an organic acid or its salt after the support is anodized, or by applying an undercoat layer underneath the photosensitive layer.

An intermediate layer may be disposed to raise adhesion between the support and the photosensitive layer. The intermediate layer generally comprises a diazo resin or a phosphoric acid compound adsorbed by aluminum. The thickness of the intermediate layer is optional, but must be a thickness capable of a uniform adhesion reaction with the overlying photosensitive layer during exposure. The amount of the intermediate layer once coated, dried and solidified is preferably approximately 1 to 100 mg/m$^2$, and more preferably 5 to 40 mg/m$^2$. The ratio of the diazo resin used in the intermediate layer is 30% to 100%, preferably 60% to 100%.

The center line average roughness of the support is 0.10 μm to 1.2 μm. When the roughness is less than 0.10 μm, adhesion with the photosensitive layer decreases and there is a notable drop in printing resistance. When the roughness is greater than 1.2 μm, stainability during printing becomes worse. Color density of the support is 0.15 to 0.65 in terms of reflection density value. When the color density is less than 0.15 (whiter), halation is too strong in the image exposure and image formation is impaired. When the color density is greater than 0.65 (blacker), an image is hardly seen in inspector of the plate after development, and plate inspectability is notably worse.

A planographic printing plate precursor in which the photopolymerizable composition of the present invention is used as the recording layer can be formed as thus described. The planographic printing plate precursor can be recorded using various light sources having wavelengths suitable for the polymerization initiators. The precursor can also be thermally recorded with an ultraviolet lamp or a thermal head.

Examples of the light source used in the image exposure include mercury lamps, metal halide lamps, xenon lamps, chemical lamps and carbon arc lamps. Examples of radiation include electron rays, X rays, ion beams and far infrared rays. G rays, i rays, deep-UV light, and high-density energy beams (laser beams) can also be used. Examples of the laser beam include helium-neon lasers, argon lasers, krypton lasers, helium-cadmium lasers and KrF excimer lasers.

It is preferable that, in a system using an infrared absorbent in combination, the image is exposed to a solid state laser and a semiconductor laser that radiate infrared rays having a wavelength of 760 nm to 1,200 nm. The output of the laser is preferably 100 mW or more, and a multi beam laser device is preferably used to shorten exposure time. The exposure time for one pixel is preferably within 20 μsec. Energy applied to the recording material is preferably 10 to 300 mJ/cm$^2$.

Conventional alkaline aqueous solutions can be used as the developing solution and replenisher used to develop and make the planographic printing plate in the present invention.

Examples thereof include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Organic alkaline compounds such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can also be used. These inorganic alkali salts and organic alkaline compounds are used either singly or in combination.

An aqueous solution of sodium silicate or potassium silicate is especially preferable. The reason is because the developability can be controlled depending on the ratio and concentration of silicon oxide $SiO_2$, which is a component of a silicate, and alkali metal oxide $M_2O$. Alkali metal silicates described in, for example, JP-A No. 54-62004 and JP-B No. 57-7427, can be effectively used.

Further, when an automatic developing machine is used for development, it is known that a large number of PS plates can be processed without changing developing solutions in the developing tank over a long period of time by adding to the developing solution an aqueous solution (replenishing solution) whose alkaline strength is greater than that of the developing solution. This is preferably applied to the invention as well. Various surfactants and organic solvents can be added as needed to the developing solution and the replenisher to accelerate or suppress developability, to disperse development sediment and to increase ink affinity of the image area of the printing plate.

Preferable examples of the surfactants include anionic, cationic, nonionic and ampholytic surfactants. The developing solution and the replenisher can also contain as needed, hydroquinone, resorcin, reducing agents such as sodium and potassium salts of inorganic acids, for example, sulfurous acid and hydrosulfurous acid, organic carboxylic acids, defoamers and water softeners.

The printing plate thus developed with the developing solution and the replenisher is post-treated with a rinse solution containing washing water and surfactants, and a solution containing gum arabic and starch derivatives. These treatments can be used in combination when the image recording material of the present invention is used as a printing plate.

In recent years, automatic developing machines for plate materials in printing have come to be used widely, particularly in the plate-making and printing industries, because of the rationalization and standardization of plate-making labor. The automatic developing machine generally comprises a development section and a post-processing section, and has a device that conveys plate material for printing, various processing fluid tanks and a spray device. A printing plate once exposed is sprayed with various processing fluids that have been drawn up by pumps and sprayed out from spray nozzles while the plate is conveyed horizontally, whereby developing processing is carried out. Recently, a method has come to be known in which printing materials are dipped and conveyed by guide rolls in processing fluid tanks filled with processing fluids. In this type of automated processing, processing can be carried out by replenishing the various processing fluids with replenishing fluids in accordance with processing amount and operation time.

The thus obtained planographic printing plate precursor can be coated with gum as required and then supplied to a printing step.

The planographic printing plate precursor having as the recording layer the photopolymerizable composition of the invention is, as described above, subjected predetermined steps, whereby an image is formed and planographic printing plate is obtained. The planographic printing plate is applied to an offset printing machine and used for printing many sheets.

Further, the photopolymerizable composition of the present invention is cured at a high density by exposure to UV light, visible light and an infrared laser, and the cured coating does not cause plastic flow. Adhesion, deformation and damage can be suppressed when the planographic printing plates are stacked and stored, and a uniform, stable coating and excellent image formability are provided. Accordingly, in addition to being used as a recording layer in a planographic printing plate precursor, the photopolymerizable composition of the present invention can also be used in flexographic printing plates, color proofs, dry lithographic films, photoresists, and color filters.

EXAMPLES

The present invention is described in detail below by way of Examples. However, the present invention is not limited thereto.

Example 1

Production of Support

An aluminum plate (material 1050) having a thickness of 0.30 mm was cleaned and degreased with trichloroethylene. Its surface was then grained with a nylon brush and a 400-mesh pumice water suspension, and washed well with water. The plate was etched by being dipped in a 25% sodium hydroxide aqueous solution at 45° C. for 9 seconds, and then washed with water. Thereafter, the plate was dipped in 2% HNO3 for 20 seconds and washed with water. At this time, the etching amount of the grained surface was approximately 3 g/m2. Subsequently, the plate was anodized with 7% H2SO4 as an electrolyte at a current density of 15 A/dm2 and a rate of 3 g/m2 to form an oxide film. The resulting plate was then washed with water. Thereafter, the following undercoat solution was coated on the aluminum plate, and the coated plate was dried at 80° C. for 30 seconds. The coating amount after the drying was 10 mg/m2.

Undercoating

Subsequently, the following undercoat solution was coated on the aluminum support with a wire bar, and then dried with a hot air drier at 90° C. for 30 seconds. The coating amount after the drying was 10 mg/m$^2$.

The composition of the undercoat solution was as follows.

| | |
|---|---|
| copolymer of ethyl methacrylate and sodium 2-acrylamide-2-methyl-1-propanesulfonate at a molar ratio of 75:15 | 0.1 g |
| 2-aminoethyl phosphonate | 0.1 g |
| methanol | 50 g |
| deionized water | 50 g |

Photosensitive Layer

Next, the following photosensitive layer coating solution [P-1] was prepared, coated on the undercoated aluminum plate with a wire bar, and dried with a hot air drier at 115° C. for 45 seconds to form a photosensitive layer. In this manner, a planographic printing plate precursor was obtained. The coating amount after drying was 1.2 to 1.3 g/m$^2$.

The composition of the photosensitive layer coating solution [P-1] was as follows.

| | |
|---|---|
| tris(acryloxyethyl) isocyanurate (melting point 52 to 54° C.: solid polymerizable compound) | 0.9 g |
| N-cyclohexylacrylamide (melting point 113° C.: solid polymerizable compound) | 0.1 g |
| infrared absorbent (structure described below) | 0.08 g |
| polymerization initiator (structure described below) | 0.25 g |
| copolymer of allyl methacrylate and methacrylic acid at a molar ratio of 80:20 (weight average molecular weight 130,000) | 1.0 g |
| copper phthalocyanine pigment colorant | 0.1 g |
| surfactant (trade name: MEGAFAX F-475 made by Dainippon Ink and Chemicals, Inc.) | 0.02 g |
| methyl ethyl ketone | 10 g |
| methanol | 5 g |
| 1-methoxy-2-propanol | 12 g |

Infrared absorbent

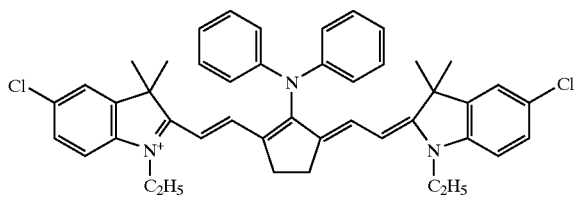

Polymerization initiator

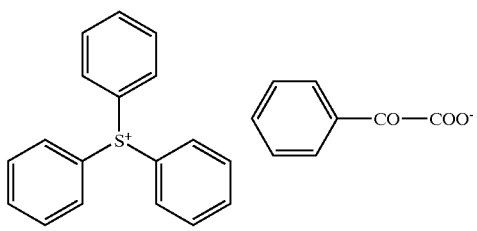

Evaluation

Fifty of the resulting planographic printing plate precursors were stacked with the photosensitive layer surfaces thereof facing upward and left at a temperature of 35° C. and humidity of 70% for 5 days. Thereafter, the stack was inverted, and when the upper most plate (i.e., the lowermost plate before the stack was inverted) was taken from the stack, it did not adhere to the plate to which it had been adjacent and could be smoothly taken from the stack.

Subsequently, the planographic printing plate precursor was continuously subjected to plate-making processing using a CTP output system of Fuji Photo Film Co., Ltd., comprising a plate supplier (trade name: SA-L8000), an exposure device (trade name: LUXEL T-9000 CTP), a conveyer (trade name: T-900 CONVEYER), an automatic developing machine (trade name: LP-1310H) and a stocker (trade name: ST-1160). A development processing tank of the automatic developing machine was filled with a developing solution having the composition described below, and maintained at 30° C. Washing water was disposed in a second bath of the automatic developing machine, and a finishing gum solution (trade name: GU-7 manufactured by Fuji Photo Film Co., Ltd.) diluted to 1:1 with water was disposed in a third bath.

The composition of the developing solution was as follows.

| | |
|---|---|
| sodium sulfite | 0.1% by weight |
| potassium hydroxide | 0.06% by weight |
| potassium carbonate | 0.2% by weight |
| ethylene glycol mononaphthyl ether | 4.8% by weight |
| EDTA tetrasodium salt | 0.13% by weight |
| silicone surfactant | 0.01% by weight |
| water | 94.7% by weight |

Fifty of the planographic printing plate precursors were loaded in the plate supplier, automatically exposed and developed, and discharged into the stocker. During that time, no problems were caused in plate supply and transportation, and plate-making was smoothly conducted. The planographic printing plates obtained by the CTP output system all had good image quality without defects such as inadvertent omissions in or damage to the image area.

Comparative Example 1

A planographic printing plate precursor was obtained in the same manner as in Example 1 except that the solid polymerizable compound [0.9 g of tris(acryloxyethyl) isocyanurate and 0.1 g of N-cyclohexylacrylamide] used in the photosensitive layer coating solution [P-1] of Example 1 was replaced with the following polymerizable compound which was liquid at 25° C.

The composition of the polymerizable compound was as follows.

| | |
|---|---|
| urethane acrylate (trade name: NK ESTER U-4HA made by Shin Nakamura Kagaku K.K., liquid) | 0.9 g |
| pentaerythritol tetraacrylate (liquid) | 0.1 g |

Evaluation

Fifty of the resulting planographic printing plate precursors were stacked with the photosensitive layer surfaces thereof facing upward and left at a temperature of 35° C. and humidity of 70° C. for 5 days. Thereafter, the stack was inverted, and the uppermost plate (i.e., the lowermost plate before the stack was inverted) adhered to the plate to which it was adjacent, and could not be taken from the stack.

Thus, it was found that even after planographic printing plate precursors using the photopolymerizable composition of the present invention as the recording layer were stacked and stored, there was neither adhesion nor deformation of recording layers, and the plates had excellent handle ability. Moreover, high-quality images were obtained.

The present invention can provide a photopolymerizable composition that is cured with visible light or an infrared laser, that can be used as a recording layer in a negative planographic printing plate precursor that can be directly recorded from digital data of a computer, that does not cause plastic flow even when forming a recording layer, that can suppress adhesion of, deformation of and damage to a recording layer even when the plates are stacked and stored, and that can form a high-quality image.

What is claimed is:

1. A photopolymerizable composition that can be cured by exposure, comprising:
   (A) a polymerizable compound which is solid at 25° C. and has at least one radical-polymerizable ethylenically unsaturated double bond and at least one amide bond in a molecule,
   (B) a radical polymerization initiator having a maximum absorption wavelength of no greater than 400 nm,
   (C) a binder polymer, and
   (D) a compound capable of generating heat by infrared exposure.

2. The photopolymerizable composition of claim 1, wherein the polymerizable compound (A) is selected from compounds having a melting point or a glass transition point of no less than 40° C.

3. The photopolymerizable composition of claim 1, wherein the polymerizable compound (A) is included in an amount of 10 to 60% by weight based on the total solid content of the photopolymerizable composition.

4. The photopolymerizable composition of claim 1, wherein the photopolymerizable composition is capable of being exposed by infrared light having a wavelength of no less than 750 nm.

5. The photopolymerizable composition of claim 4, wherein the radical polymerization initiator (B) comprises an onium salt.

6. The photopolymerizable composition of claim 5, wherein the onium salt comprises at least one represented by the following formulas (III) to (V):

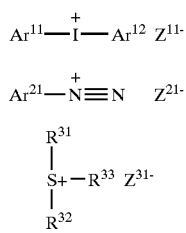

Formula (III)

Formula (IV)

Formula (V)

wherein each of $Ar^{11}$, $Ar^{12}$ and $A^{21}$ independently represents an optionally substituted aryl group having no more than 20 carbon atoms; each of $Z^{11-}$, $Z^{21-}$ and $Z^{31-}$ independently represents a counter ion selected from the group consisting of a halogen ion, a carboxylate ion, a perchlorate ion, a tetrafluoroborate ion, a hexafluorophosphate ion and a sulfonate ion; and each of $R^{31}$, $R^{32}$ and $R^{33}$, which may be same or different, represents an optionally substituted hydrocarbon group having no more than 20 carbon atoms.

7. The photopolymerizable composition of claim 1, wherein the photopolymerizable composition is capable of being exposed by an infrared laser.

8. The photopolymerizable composition of claim 1, wherein the radical polymerization initiator (B) is included in an amount of 0.1 to 50% by weight based on the total solid content of the photopolymerizable composition.

9. The photopolymerizable composition of claim 1, wherein the binder polymer (C) includes an acrylic resin or a methacrylic resin having on a side chain thereof a benzyl group or an allyl group and a carboxyl group.

10. The photopolymerizable composition of claim 1, wherein the binder polymer (C) has a weight average molecular weight of 10,000 to 300,000, a number average molecular weight of 2,000 to 250,000 and a degree of polydispersion (weight average molecular weight/number average molecular weight) of 1.1 to 10.

11. The photopolymerizable composition of claim 1, wherein the binder polymer (C) is a random polymer.

12. The photopolymerizable composition of claim 1, wherein the binder polymer (C) is included in an amount of 20 to 95% by weight based on the total solid content of the photopolymerizable composition.

13. A photopolymerizable composition that can be cured by exposure, comprising:
(A) a polymerizable compound which is solid at 25° C. and has at least one radical-polymerizable ethylenically unsaturated double bond and at least one amide bond in a molecule,
(B) a radical polymerization initiator which includes at least one of benzil, benzoin ether, Michler's ketone, anthraquinone, acridine, phenazine and benzophenone,
(C) a binder polymer, and
(D) a compound capable of generating heat by infrared exposure.

14. The photopolymerizable composition of claim 13, wherein the polymerizable compound (A) is selected from compounds having a melting point or a glass transition point of no less than 40° C.

15. The photopolymerizable composition of claim 13, wherein the polymerizable compound (A) is included in an amount of 10 to 60% by weight based on the total solid content of the photopolymerizable composition.

16. The photopolymerizable composition of claim 13, wherein the photopolymerizable composition is capable of being exposed by infrared light having a wavelength of no less than 750 nm.

17. The photopolymerizable composition of claim 16, wherein the radical polymerization initiator (B) comprises an onium salt.

18. The photopolymerizable composition of claim 17, wherein the onium salt comprises at least one represented by the following formulas (III) to (V):

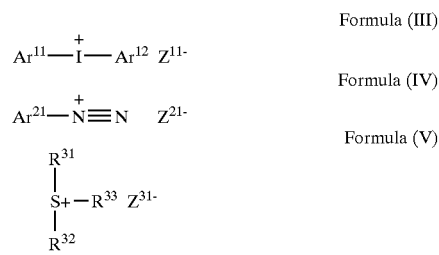

Formula (III)

Formula (IV)

Formula (V)

wherein each of $Ar^{11}$, $Ar^{12}$ and $Ar^{21}$ independently represents an optionally substituted aryl group having no more than 20 carbon atoms; each of $Z^{11-}$, $Z^{21-}$ and $Z^{31-}$ independently represents a counter ion selected from the group consisting of a halogen ion, a carboxylate ion, a perchlorate ion, a tetrafluoroborate ion, a hexafluorophosphate ion and a sulfonate ion; and each of $R^{31}$, $R^{32}$ and $R^{33}$, which may be same or different, represents an optionally substituted hydrocarbon group having no more than 20 carbon atoms.

19. The photopolymerizable composition of claim 13, wherein the photopolymerizable composition is capable of being exposed by an infrared laser.

20. The photopolymerizable composition of claim 13, wherein the radical polymerization initiator (B) is included in an amount of 0.1 to 50% by weight based on the total solid content of the photopolymerizable composition.

21. The photopolymerizable composition of claim 13, wherein the binder polymer (C) includes an acrylic resin or a methacrylic resin having on a side chain thereof a benzyl group or an allyl group and a carboxyl group.

22. The photopolymerizable composition of claim 13, wherein the binder polymer (C) has a weight average molecular weight of 10,000 to 300,000, a number average molecular weight of 2,000 to 250,000 and a degree of polydispersion (weight average molecular weight/number average molecular weight) of 1.1 to 10.

23. The photopolymerizable composition of claim 13, wherein the binder polymer (C) is a random polymer.

24. The photopolymerizable composition of claim 13, wherein the binder polymer (C) is included in an amount of 20 to 95% by weight based on the total solid content of the photopolymerizable composition.

* * * * *